(12) United States Patent
Graefe et al.

(10) Patent No.: US 9,606,746 B2
(45) Date of Patent: Mar. 28, 2017

(54) SHIFTABLE MEMORY SUPPORTING IN-MEMORY DATA STRUCTURES

(75) Inventors: Goetz Graefe, Madison, WI (US);
Terence P. Kelly, Palo Alto, CA (US);
Harumi Kuno, Cupertino, CA (US);
Robert E. Tarjan, Princeton, NJ (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 218 days.

(21) Appl. No.: 14/349,113

(22) PCT Filed: Oct. 27, 2011

(86) PCT No.: PCT/US2011/058185
§ 371 (c)(1),
(2), (4) Date: Apr. 2, 2014

(87) PCT Pub. No.: WO2013/062562
PCT Pub. Date: May 2, 2013

(65) Prior Publication Data
US 2014/0297985 A1    Oct. 2, 2014

(51) Int. Cl.
| | | |
|---|---|---|
| G06F 3/00 | (2006.01) |
| G06F 7/00 | (2006.01) |
| G06F 3/06 | (2006.01) |
| G11C 15/04 | (2006.01) |
| G11C 19/00 | (2006.01) |

(Continued)

(52) U.S. Cl.
CPC .......... *G06F 3/0647* (2013.01); *G06F 3/0604* (2013.01); *G06F 3/0673* (2013.01); *G11C 15/04* (2013.01); *G11C 19/00* (2013.01); *G11C 19/188* (2013.01); *G11C 19/287* (2013.01)

(58) Field of Classification Search
None
See application file for complete search history.

(56) References Cited

U.S. PATENT DOCUMENTS

| | | |
|---|---|---|
| 3,449,887 A | 6/1969 | Abramson |
| 3,670,313 A | 6/1972 | Beausoleil et al. |

(Continued)

FOREIGN PATENT DOCUMENTS

| | | |
|---|---|---|
| CN | 1762027 A | 4/2006 |
| CN | 101162471 A | 4/2008 |

(Continued)

OTHER PUBLICATIONS

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549

(Continued)

*Primary Examiner* — Idriss N Alrobaye
*Assistant Examiner* — Richard B Franklin
(74) *Attorney, Agent, or Firm* — North Shore Associates

(57) ABSTRACT

A shiftable memory supporting in-memory data structures employs built-in data shifting capability. The shiftable memory includes a memory having built-in shifting capability to shift a contiguous subset of data from a first location to a second location within the memory. The shiftable memory further includes a data structure defined on the memory to contain data comprising the contiguous subset. The built-in shifting capability of the memory to facilitate one or more of movement of the data, insertion of the data and deletion of the data within the data structure.

12 Claims, 5 Drawing Sheets

(51) Int. Cl.
    *G11C 19/18*    (2006.01)
    *G11C 19/28*    (2006.01)

(56) References Cited

U.S. PATENT DOCUMENTS

| | | |
|---|---|---|
| 3,708,690 A | 1/1973 | Paivinen |
| 3,760,382 A | 9/1973 | Itoh |
| 3,797,992 A | 3/1974 | Brown |
| 3,812,336 A | 5/1974 | Bossen et al. |
| 3,893,088 A | 7/1975 | Bell |
| 4,037,205 A | 7/1977 | Edelberg et al. |
| 4,133,043 A | 1/1979 | Hiroshima et al. |
| 4,322,635 A | 3/1982 | Redwine |
| 4,504,925 A | 3/1985 | Gilhousen |
| 4,521,874 A | 6/1985 | Rau et al. |
| 4,532,606 A | 7/1985 | Phelps |
| 4,845,670 A | 7/1989 | Nishimoto et al. |
| 4,864,544 A | 9/1989 | Spak et al. |
| 4,903,240 A | 2/1990 | Von Flue |
| 4,969,148 A | 11/1990 | Nadeau-Dostie et al. |
| 5,153,846 A | 10/1992 | Rao |
| 5,299,156 A | 3/1994 | Jiang et al. |
| 5,313,433 A | 5/1994 | Waller |
| 5,504,919 A | 4/1996 | Lee et al. |
| 5,543,748 A | 8/1996 | Ando |
| 5,677,864 A | 10/1997 | Chung |
| 5,698,997 A | 12/1997 | Williamson et al. |
| 5,930,323 A | 7/1999 | Tang et al. |
| 6,021,075 A | 2/2000 | Ueno |
| 6,061,417 A | 5/2000 | Kelem |
| 6,239,638 B1 | 5/2001 | Masuda |
| 6,362,660 B1 | 3/2002 | Deng |
| 6,418,182 B1 | 7/2002 | Suyama |
| 6,515,895 B2 | 2/2003 | Naji |
| 6,519,204 B2 | 2/2003 | Slamowitz et al. |
| 6,526,505 B1 | 2/2003 | Epstein |
| 6,745,216 B1 | 6/2004 | Nakamura |
| 6,765,832 B1 | 7/2004 | Ohtani |
| 6,834,005 B1 | 12/2004 | Parkin |
| 7,051,153 B1 | 5/2006 | Lin et al. |
| 7,139,946 B2 | 11/2006 | Nadeau-Dostie |
| 7,310,757 B2 | 12/2007 | Ngo et al. |
| 7,508,701 B1 | 3/2009 | Liang et al. |
| 7,573,310 B2 | 8/2009 | Yang et al. |
| 7,608,849 B2 | 10/2009 | Ino et al. |
| 7,791,376 B2 | 9/2010 | Lim et al. |
| 7,864,560 B2 | 1/2011 | Tran |
| 7,872,896 B2 | 1/2011 | Hung |
| 2002/0089024 A1 | 7/2002 | Iwata |
| 2004/0027863 A1 | 2/2004 | Lee et al. |
| 2004/0239606 A1 | 12/2004 | Ota |
| 2005/0138501 A1 | 6/2005 | Motika et al. |
| 2006/0218341 A1 | 9/2006 | Nolte et al. |
| 2006/0273823 A1 | 12/2006 | Kamp et al. |
| 2007/0080345 A1 | 4/2007 | Joo et al. |
| 2007/0211531 A1 | 9/2007 | Atti et al. |
| 2007/0294469 A1 | 12/2007 | Teruyama |
| 2009/0193384 A1 | 7/2009 | Sima et al. |
| 2009/0262566 A1 | 10/2009 | Kurjanowicz |
| 2009/0294869 A1 | 12/2009 | Chen |
| 2011/0022791 A1 | 1/2011 | Iyer et al. |
| 2011/0106742 A1 | 5/2011 | Pino |
| 2011/0116328 A1 | 5/2011 | Gupta et al. |
| 2012/0138885 A1 | 6/2012 | Wu et al. |

FOREIGN PATENT DOCUMENTS

| | | |
|---|---|---|
| CN | 101383188 | 3/2009 |
| CN | 101477453 | 7/2009 |
| CN | 101594319 A | 12/2009 |
| EP | 0237337 A2 | 9/1987 |
| EP | 0827156 | 4/1998 |
| GB | 2393277 | 3/2004 |
| JP | 63231798 | 9/1988 |
| JP | 5066921 | 9/1993 |
| JP | 2005071500 | 3/2005 |
| WO | WO-9314459 | 7/1993 |
| WO | WO-2013002772 | 1/2013 |

OTHER PUBLICATIONS

Graefe, G., "B-tree Indexes, Interpolation Search,and Skew," IEEE Proceedings of the Second International Workshop on Data Management on New Hardware (DaMoN 2006), Jun. 25, 2006, Chicago, IL (10 pages).

PCT Search Report/Written Opinion ~ Application No. PCT/US2011/058185 dated Feb. 9, 2013 ~ pp. 9.

Roberto Perez-Andrade et al., "A Versatile Linear Insertion Sorter Based on a FIFO Scheme," IEEE Computer Society Annual Symposium on VLSI, 2008, pp. 357-362.

Bender et al., Insertion Sort is O (n log n), In Proceedings of the Third International Conference on FunWith Algorithms (FUN), 2004 (6 pages).

Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.

European Patent Office, Extended EP Search Report, Application No. 11868835.7-1805 dated Feb. 3, 2015 (8 pages).

Han et al., Integer Sorting in (n √loglog n) Expected Time and Linear Space, 2002 (10 pages).

IEEE P1003.1, Draft 6, Apr. 2001/Open Group Technical Standard, Issue 6, Draft Standard for Information Technology—Portable Operating System Interface (POSIX) (23 pages).

Mikkel Thorup, Chapter 1—On RAM priority queues, 1996 (9 pages).

PCT Search Report, PCT/US2011/058461, May 31, 2012, 3 Pgs.

PCT Search Report/Written Opinion~Application No. PCT/US2011/042223 dated Jan. 2, 2012~8 pages.

PCT: "Notification of Transmittal of the International Search Reeport and the Written Opinion of The International Searching Authority, or the Declaration"; cited in PCT/US2011/058462; mailed Feb. 9, 2012; 8 pages.

Pickett et al., "Coexistence of Memristance and Negative Differential Resistance in a Nanoscale Metal-Oxide-Metal System," IEEE Advanced Materials, 2011, pp. 23, 1730-1733.

Stephen C. Johnson, Algorithms for the 21st century presented at the 2006 USENIX Annual Technical Conference, Boston, MA, vol. 31, No. 5 (7 pages).

| 00 | 01001000 |
|---|---|
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
|---|---|
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
|---|---|
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
|---|---|
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

SHIFTABLE MEMORY SUPPORTING IN-MEMORY DATA STRUCTURES

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

However, the historical architectural division of processing in the processor and storage in memory does raise certain issues and present practical problems for implementation that are becoming more and more evident as time goes on. In particular, the conventional architectural division that centralizes all processing in the CPU while relegating the main memory to providing storage can and does present problems, especially when considering data stored and manipulated using data structures.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example in accordance with the principles described herein.

FIG. 1B illustrates an example of an upshift of a contiguous subset of data stored in a linear array within a shiftable memory, according to an example in accordance with the principles described herein.

Figures 2, 3:
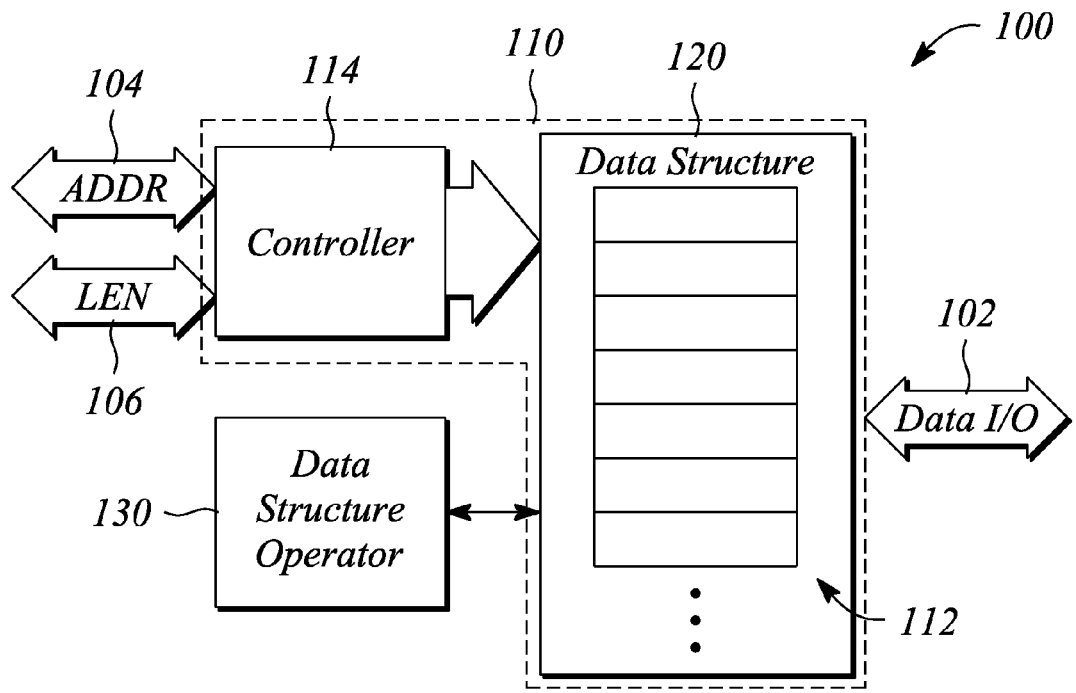
FIG. 2 illustrates a block diagram of a shiftable memory supporting in-memory data structures, according to an example of the principles described herein.
FIG. 3 illustrates a truth table of an augmented decoder, according to an example of the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide in-memory data structures and data structure operations associated therewith in a memory with built-in data shifting capability. In particular, the data shifting capability is substantially built into the memory, according to various examples of the principles described herein. The built-in data shifting capability provides a translation or shift of a contiguous subset of data stored in the memory while the data structure provides an organization of the stored data that is manipulated by the data structure operations. Examples in accordance with the principles described herein have application to a variety of data processing systems.

According to various examples, the contiguous subset of stored data (e.g., data words) may be shifted within the memory from a memory first or initial location to a second or final location in the memory. The data retain an ordered relationship within the contiguous subset when shifted to the second location, according to some examples. Moreover, the shift takes place entirely within the memory and the shift is generally accomplished without using resources, such as a processor, that are outside of the memory. Further, the shift does not involve data being moved between a processor and the memory, according to various examples. As a result, the memory with built-in shifting capability is referred to as 'shiftable memory' herein.

In some examples, the shift provided by the shiftable memory herein may be employed to 'open' a location in memory into which a new data may be inserted. In particular, during an operation on a data structure, a memory location either above or below the contiguous subset of stored data may be rendered available for data insertion when the contiguous subset of stored data is moved by the shift within the shiftable memory. Then data may be added or inserted into the opening as a further part of the data structure operation, for example.

According to other examples, the shift may be used to delete or 'overwrite' data stored one of above a beginning of the contiguous subset and below an end of the contiguous subset. In particular, during a data structure operation the data stored above or below the contiguous subset may be overwritten with a portion of the contiguous subset itself, when the contiguous data is shifted by the shiftable memory. For example, if the contiguous subset of stored data is part of a larger data structure (e.g., an array of data words) in the shiftable memory, the shift may have the effect of deleting a portion of the data (e.g., one or more data words) in the larger data structure as part of the data structure operation.

According to some examples, shifting data to either insert data or delete data in the shiftable memory may be accomplished in less time, and in some examples in considerably less time, than is generally possible without using shiftable memory. In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data is not read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

According to various examples, shifting within the shiftable memory may be implemented with circuitry of the shiftable memory itself. As such, shifting using shiftable memory does not require sequentially reading and writing each data word of the contiguous subset. For example, shifting using shiftable memory may shift all of the data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., re-writable optical discs), magnetic memory (e.g., computer hard drives) and various memory structures based on latches, flip-flops and other bi-stable constructs.

Also herein by definition, a memory may comprise a plurality of groups of memory cells. A plurality of memory cells may be also be arranged as an array, according to some examples. For example, the memory cells may be arranged as a linear array. In another example, the memory cells are arranged in a two dimensional (2-D) array. Higher order (e.g., three or more dimensions) arrays also may be employed. In some examples, a lower order array (e.g., a linear array) is defined on an array with a larger dimension (e.g., 2-D array). For example, a linear array may be defined by an addressing arrangement on a rectangular 2-D array of memory cells. In addition, arrays may be divided into sub-arrays. For example, a 2-D array may be divided into quadrants as four sub-arrays. According to various examples, the array may be either a physical array or a logical array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A memory cell is a circuit or a related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, the memory cell may hold or store a complete data word comprising the plurality of bits, as defined herein. For example, a memory cell may hold 4, 8, 16, 32 or 64 binary bits. In yet another example, the memory cell may hold data in another form (e.g., a hexadecimal value, an analog value, etc.). In particular, memory cells, as defined herein, are not restricted to storing data in a binary format but may, in some examples, hold or store an arbitrary data construct. However, for discussion purposes herein, binary data is generally employed throughout by way of example and not by way of limitation, unless otherwise stipulated.

As used herein, a 'register' or equivalently 'memory register' is defined as a collection or grouping of memory cells. Further herein, a register comprising a grouping of memory cells may hold data (e.g., a plurality of data bits) that constitute the data word of a particular computer system. Hence, the contents of a register are generally referred to as a 'data word,' herein. In some examples, the memory cells of a memory register are physically adjacent to one another. For example, a first memory cell of a memory register may be located immediately next to a second memory cell of the memory register. In other examples, the memory cells of a memory register are logically related instead of or in addition to being physically collocated. In particular, adjacent memory cells may not be necessarily physically adjacent to be logically adjacent, in some examples.

Memory cells are also often referred to as 'memory locations' herein. Strictly speaking, a memory location is a memory cell(s) at a particular location within the memory, the location being designated or identified by an address. The memory cell is accessed using the address, for example. However, for simplicity of discussion herein, memory cells are generally referred to as having or being at an address. Addresses or locations may be associated with a shiftable unit (e.g., a data word) of the memory, for example. As such 'location' and address may be employed interchangeably herein. In addition 'location' may be used to refer to a location of a contiguous set of data that is designated by a starting address and an ending address, according to some examples. In other examples, the location of the contiguous set may be designated by a starting (or an ending) address and a length of the contiguous set.

Adjacent memory cells as defined by adjacent memory locations may be physically adjacent (i.e., located next to one another) or logically adjacent, by definition herein. Logical adjacency may be established by an overlying logical memory structure (e.g., using indirection), according to some examples. For example, logically adjacent memory cells may be physically separated from one another but still be considered adjacent in terms of an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shiftable memory acquires a contiguity that is analogous to and dictated by the adjacency of the memory cells, by definition herein.

Further herein and as noted above, a shift as performed by shiftable memory is defined as a translation of a contiguous subset of data stored within the memory, unless otherwise stipulated. In particular, by definition herein, a shift using shiftable memory constitutes the translation (e.g., up or down an array) of the stored data (e.g., data words) within the contiguous subset from a first location to a second location within the memory. Furthermore, the shift, when applied to the contiguous subset of stored data, translates all of the stored data within the contiguous subset. Moreover, the shift by shiftable memory does not result in a translation or shift of data outside of the subset of data involved in the shift, by definition herein. In general, the shift may move the data by a distance of one or more memory locations or memory addresses. For example, the shift may move the data a single memory location up or down within the memory.

Herein, the direction 'up' is defined with respect to memory locations within the shiftable memory as a direction toward locations having smaller addresses. The direction 'down' is defined as a direction toward locations having larger addresses. Hence, an 'upshift' is defined as moving or shifting the data to a second location having a smaller address than an address of a first or starting location. Conversely, a 'downshift' results in moving or shifting the data from a first location having a smaller address to a second location with a larger address. However, while the shift direction is controllable or selectable according to some examples, the shift direction (e.g., up or down) may be completely arbitrary, as employed herein. Further, the specific use of 'upshift' and 'downshift' herein is for discussion purposes and not by way of limitation.

FIG. 1A illustrates an example of a downshift of a contiguous subset of data stored in a linear array within a shiftable memory, according to an example of the principles described herein. In particular, FIG. 1A illustrates a plurality of memory cells, each of which is capable of storing a data word. For example, the data words may comprise eight binary bits, each bit (e.g., either a '1' or '0') being stored in a separate one of eight memory cells. Further as illustrated, each of the illustrated memory cells is identified by an address ranging from 00 to 11. A left side of FIG. 1A illustrates the plurality of memory cells before the downshift while a right side illustrates the same plurality of memory cells after the downshift.

As illustrated, the example downshift within the shiftable memory comprises selecting a contiguous subset of stored data words starting with a memory cell at address 04 and ending with a memory cell at address 08, for example. The selected contiguous subset contains data words {11001010, 01001010, 11111011, 0000001, 11011011} in the illustrated example. The shiftable memory then downshifts the selected contiguous subset of data words by moving the stored data words down one address location, as illustrated in the right side of FIG. 1A. The downshift maintains an order of the data words within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last data word (i.e., '11011011') of the downshifted contiguous subset. Further, the memory cell at address 04 which originally held the first data value of the contiguous subset is rendered indeterminate as indicated by the 'X'. According to various examples, the memory cell at address 04 may retain a copy of the data word (e.g., '11001010') that was present before the downshift or may be cleared (e.g., set to '00000000') after the downshift.

In some examples, the memory cell at address 04 may be available for insertion of a data word from an external source, for example. A data word may be inserted into the memory cell at address 04 by sequentially presenting and clocking or shifting individual bits of the inserted data word into the memory cells of the memory cell at address 04 (e.g., a serial write), according to some examples.

FIG. 1B illustrates an example of an upshift of a contiguous subset of data stored in a linear array within a shiftable memory, according to an example of the principles described herein. In particular, FIG. 1B illustrates a plurality of memory cells each of which stores a data word (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift.

As illustrated in FIG. 1B, the upshift in shiftable memory comprises selecting a contiguous subset of stored data words starting with a memory cell at address 03 and ending with a memory cell at address 06, for example. The shiftable memory then upshifts the selected contiguous subset by moving the stored data words in the selected contiguous subset up one address location, as illustrated in the right side of FIG. 1B. The upshift maintains an order of the words within the contiguous subset and deposits the contiguous subset in memory cells between address 02 and address 05. Upshifting the stored data words overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data word (e.g., 'stu') that was present before the upshift or may be cleared (e.g., set to '000') after the upshift. In some examples, the memory cell at address 06 may be available for insertion of data from an external source, for example.

According to various examples, the shiftable memory may be a portion of a main memory of a general-purpose computer system. The shiftable memory may represent a subset of the memory that makes up the main memory, for example. Furthermore according to various examples, the shiftable memory is distinct from memory cells, cache and other relatively small memory structures often found integrated together with other components (e.g., an arithmetic logic unit, controller, etc.) in a microprocessor, for example. In particular, shiftable memory by definition herein is part of the main memory and as such, is separate from a processor of a general-purpose computer system or related processing system, according to various examples. In addition, shiftable memory typically contains an order of magnitude or more memory storage than is present or can be present in the processor, according to some examples. For example, shiftable memory may include many megabytes or even gigabytes of memory storage whereas processor memory storage typically may be limited to less than a few tens of bytes (e.g., processor registers) to a few megabytes (e.g., L1 cache, L2 cache etc.). According to some examples, the shiftable memory may be a specialized partition of the main memory or a subsystem thereof.

Herein, a 'data structure' is defined as a structure in memory that contains and provides an organization of data stored in the memory. Examples of data structures include, but are not limited to, arrays and lists, strings, tree structures (e.g., B-trees, B+ trees, etc.), heaps, hash tables, stacks, data graphs, queues and hybrids thereof. For example, data structures as defined herein may include various hybrid data structures such as, but not limited to, a hash table having buckets that are balanced trees, a tree having nodes that are hash tables, and so on. In some examples, data structures may be further defined as structures that contain data that is sorted or otherwise organized according to a specific rule or construct. For example, a B+ tree may contain data records that are sorted in one of an ascending manner and a descending manner according to either a value of the data record itself or a key that identifies the data record. A B+ tree may be used to contain names and associated phone numbers (i.e., data records) sorted alphabetically based on the names, for example.

Herein, a 'data structure operation' refers to and is defined as an operation or an action performed on a data structure, or more precisely, on data contained by or in a data structure. A 'data structure operator', by definition, is an operator that performs or implements a data structure operation. For example, a data structure operation may comprise a search for a specific data record among a plurality of data records contained by a data structure. Likewise, a search operator that operates on the data structure is a data structure operator, for example. In another example, a shift operator that causes data to be shifted (e.g., upshifted or downshifted) within the data structure is a data structure operator while the shift itself is considered a data structure operation. Note that a distinction may be made between an operator that causes or initiates an action and means for carrying out the action. For example, a shift operator may initiate a shift of data in a data structure while shiftable memory on which the data structure is defined may be responsible for actually carrying out the shift initiated by the shift operator.

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100 supporting in-memory data structures, according to an example of the principles described herein. The shiftable memory 100 provides moving or shifting of a contiguous subset of data in the shiftable memory 100. Shifting of data by the shiftable memory 100 shifts only the data in the contiguous subset and not other data outside of the contiguous subset. In particular, when the shiftable memory 100 performs a shift of the contiguous subset, only data of the contiguous subset is affected, according to various examples. The shift does not shift other data located outside of the contiguous subset, for example. Further, the shift moves the contiguous subset of data without substantially changing or otherwise affecting an order of the data in the contiguous subset, according to some examples. Additionally, the shiftable memory 100 supports one or more in-memory data structures defined on the shiftable memory 100. The data structure may facilitate data processing and manipulation employing the shifting provided by the shiftable memory 100, according to various examples.

By 'defined on' it is meant that the data structure employs memory comprising the shiftable memory 100 to store data of the data structure, by definition herein. Further by definition herein, 'in-memory' means that the data structure is in memory (i.e., stores data in memory) and that the memory comprises the shiftable memory 100. For example, the in-memory data structure may store data in both of the shiftable memory 100 and conventional or 'non-shiftable' memory, according to some examples.

In some examples, an external resource (e.g., a processor) communicates data to and from the shiftable memory 100 via a data bus (Data I/O) 102. For example, data to be stored in the shiftable memory 100 may be communicated from the external resource to the shiftable memory 100 via the data bus 102. Similarly, data that is stored in and subsequently read from the shiftable memory 100 may be communicated to the external resource from the shiftable memory 100 via the data bus 102, for example. Information used to control an operation of the shiftable memory 100 such as, but not limited to, an address and a length of the contiguous subset may be communicated to the shiftable memory 100 using an address bus (ADDR) 104 and a length bus (LEN) 106, according to some examples. A single address bus that carries both the address and the length or alternatively, a pair of addresses, may be employed in other examples (not illustrated).

As illustrated, the shiftable memory 100 supporting in-memory data structures comprises a memory 110 to store data. The memory 110 has built-in shifting capability to shift a contiguous subset of the data from a first location to a second location within the memory. In particular, the built-in shifting capability is configured to shift the contiguous subset of data substantially within the memory 110. During the shift, the data is not transferred out of the memory 110 to accomplish the shift, according to various examples. For example, the second location may represent a shift relative to the first location of a single unit of data (e.g., a data word). The shift may be accomplished by moving data along pathways within the memory 110 from the first location to an adjacent location of the memory 110 representing the second location, for example.

Moving data to the adjacent location is referred to as an 'adjacent-location transfer' herein. In another example, the shift may move the contiguous subset of data by more than one data unit (e.g., two or more data words). A shift of two or more data units may be accomplished by a direct shift using internal data pathways of the memory 110 from the first location to the second location that is two or more data units distant from the first location, for example. In other examples, the memory 110 having built-in shifting capability may move the data in a series of smaller steps (e.g., a plurality of adjacent-location transfers) to achieve the shift of more than one data unit. However, in each example, a built-in shifting capability of the memory 110 accomplishes the shift substantially without relying on or employing a transfer of the data in and out of the memory 110, according to various examples of the principles described herein.

According to some examples, the memory 110 comprises a plurality of memory cells 112 configured as an aggregate to store data. In some examples, the stored data may correspond to a data word. In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data word. In particular, according to some examples, each memory cell 112 comprises a plurality of memory locations configured as an aggregate to store data bits corresponding to the data word. The plurality of data bits of the data word defines a width of the memory cell 112. In other examples, the memory cell 112 may store the data in a form other than as one or more binary bits.

According to various examples, the memory 110 may be implemented using substantially any memory technology. For example, memory cells of the memory 110 may be implemented using static random access memory (SRAM) memory cells 112. In another example, one or more flip-flops such as, but not limited to, a D flip-flop, may be employed to implement the memory cells 112 of the memory 110. In other examples, yet another memory technology (e.g., DRAM, memristors, etc.) may be used to implement the memory cells 112 of the memory 110.

According to some examples, the memory 110 further comprises a controller 114. The controller 120 is configured to select a contiguous subset of the stored data. The controller 114 is further configured to control shifting of the selected contiguous subset from a first location to a second location within memory 110. The selected contiguous subset has a length that is less than a total length of the memory 110, according to various examples of the principles described herein. Using one or more control signals, the controller 120 may cause the memory 110 to shift the selected contiguous subset by instructing the memory 110 to perform the shift, for example.

In various examples, the memory 110, or more generally the shiftable memory 100, facilitates one or both of an upshift and a downshift of the contiguous subset of data (e.g., data words). In particular, a memory cell 112 of the second location within the memory 110 may be located either above or below a corresponding memory cell 112 of the first location, depending on a direction of the shift. In some examples, the memory cell 112 of the second location is a single memory cell (or memory location) away from the corresponding memory cell 112 of the first location. In other words, the shift represents movement of the contiguous subset of stored data by a single memory location or address. In other examples, the second location represents a movement of more than a single memory cell 112. For example, the data in the form of data words may be stored as a linear array of bits within the shiftable memory and the shift may be a number of bits equal to a length of the data word in bits.

In some examples, the selected contiguous subset is specified by both of an address of a first memory cell 112 of the contiguous subset and an address of a last memory cell 112 in the contiguous subset. For example, the first memory cell address and the last memory cell address are communicated to the controller 114 (e.g., via an address bus) to facilitate selecting the contiguous subset. The first memory cell address and last memory cell address may be communicated either sequentially as a first address followed by a second address over a single bus (e.g., ADDR 104), according to various examples. Alternatively, the first and last addresses may be communicated in parallel as two simultaneous addresses either over two buses or over two portions of a single, wide bus, for example.

In another example, the selected contiguous subset is specified by an address of the first memory cell 112 and a length of the contiguous subset (e.g., via ADDR 104 and LEN 106, as illustrated). In some of these examples, the length may be the length of the contiguous subset that follows the first memory cell 112 such that the last memory cell address is given by a sum of the first memory cell address and the length. In other examples, the length includes the first memory cell 112 such that the last memory cell address is given by the first memory cell address plus the length, minus one. Other examples may specify the last memory cell address and the length of the contiguous subset that precedes the last memory cell, as well as other schemes, for example.

In some examples, the controller 114 comprises an augmented decoder. The augmented decoder employs information regarding the address and length (or alternatively the first and last memory cell addresses) to select the contiguous subset of stored data. In some examples, the augmented decoder uses the information (e.g., address and length of the contiguous subset) to assert an output corresponding to each of the memory cells of the selected contiguous subset within the memory 110. Asserting an output may comprise outputting a logic '1' on a connection path or wire (e.g., a word line W) between the augmented decoder and the plurality of memory cells 112, for example. As such, the augmented decoder may output a logic '1' on a plurality of word lines of the memory 110, the word lines corresponding to the memory cells 112 that contain the stored data of the selected contiguous subset. The word lines may be connected to a load enable (LE) input or a select (SEL) input of the memory cells 112, for example. In other examples, asserting an output comprises outputting a logic '0'. Asserting a logic '0' may be used when the memory cells 112 have a 'not' load enable ($\overline{LE}$) input or a 'not' select ($\overline{SEL}$) input, for example.

In some examples, the augmented decoder is further configured to assert an additional output corresponding to one of a memory cell 112 adjacent to and immediately above the selected contiguous subset or a memory cell 112 adjacent to and immediately below the selected contiguous subset. For example, the additional output corresponding to the memory cell 112 immediately above the selected contiguous subset may be asserted when the stored data is to be upshifted within the memory 110. The additional output corresponding to the memory cell 112 immediately below the selected contiguous subset may be asserted when the stored data is to be downshifted within the memory 110, for example. In particular, the additional output may be used to enable the memory cell 112 that receives stored data from either the first memory cell 112 or the last memory cell 112 of the contiguous subset of data.

FIG. 3 illustrates a truth table of an augmented decoder, according to an example of the principles described herein. In particular, the augmented decoder corresponding to the illustrated truth table is configured to select the contiguous subset in an example memory 110 having eight memory cells 112. The truth table has three address inputs (ADDR), a length (LEN) input and eight word lines W (i.e., $W_0$-$W_7$). The eight word lines W may correspond to load enable (LE) inputs of eight memory cells 112 in the example memory 110, for example. As can be seen in the truth table, for a value of LEN equal to '00', the augmented decoder functions substantially similar to a conventional decoder (i.e., only one word line W is asserted at a time). However, a plurality of word lines W are asserted for all other values of LEN to facilitate simultaneous enabling of a corresponding plurality of memory cells 112 that hold or store the selected contiguous subset of stored data to be shifted.

In some examples, the augmented decoder may be implemented using a read only memory (ROM). The ROM is programmed with a truth table that specifies the functionality of the augmented decoder. A decoder of the ROM decodes an input (e.g., ADDR and LEN) and the programmed connections within the ROM augment the output of the ROM decoder to produce the augmented decoder functionality, for example. In another example, a conventional decoder may be augmented with an output circuit other than the programmed connections to implement the augmented decoder. In yet another example, the augmented decoder may be implemented using a latched ripple cascade.

The shiftable memory 100 supporting in-memory data structures further comprises a data structure 120. In particular, the data structure 120 is defined on the memory 110 and is configured to contain data. The data contained by the data structure 120 comprises the contiguous subset, according to various examples. In some examples, the data structure further comprises data that is not part of the contiguous subset but is still within the memory 110.

In some examples, the data structure 120 further comprises data that is stored outside of the memory 110. For example, the data structure 120 may encompass or span both conventional memory and the memory 110 of the shiftable memory 100. In some examples, the data structure 120 may be substantially located in conventional, non-shiftable memory with portions of the data stored in the data structure being moved (e.g., moved temporarily) into the shiftable memory 100. For example, the data may be moved for the purposes of shifting the contiguous subset. After shifting, data comprising some or all of the shifted contiguous subset of data may be moved from the shiftable memory 100 back into conventional memory, for example.

According to some examples, the built-in shifting capability of the memory 110 is configured to facilitate maintaining a substantially sorted order of the data. In some examples, the built-in shifting capability of the memory 110 is further configured to facilitate sorting the data into a substantially sorted order. In particular, the built-in shifting capability is configured to provide one or both of insertion of the data and deletion of the data, in some examples. The insertion and deletion provided may be employed to one or both of sort the data and then to substantially maintain an order (i.e., the sorted order) of the data, once sorted, for example. Of course, in general sorting and maintaining the sorted order may employ other operations (e.g., searching, comparing, etc.) in addition to the insertion and deletion provided by the memory 110, according to various examples.

In some examples, the data structure 120 contains data comprising data records. Data records may be viewed as the 'actual' data stored in and organized by the data structure, as employed herein. For example, the 'actual' data represented by a data record related to an individual person may comprise one or more of a name of the person, a phone number, a birth date, an address, etc. In other examples, the data comprises pointers to data records. The pointers are data that 'points to' or provides a location of other data (e.g., another pointer, a particular data record, etc.). In some examples, the data comprises a combination of pointers and data records.

In some examples, the data of the data structure 120 comprises or further comprises a ghost record. A ghost record is a pseudo-deleted record that occupies a physical space or spaces within the data structure 120 but does not represent an actual or extant data record. As such, a ghost record generally does not impact data contents of the data structure 120. According to some examples, ghost records may provide a 'lightweight' mechanism for logically deleting a record(s) with minimal impact on a physical structure or structures of a database system. Ghost records may help a transaction ensure that neither space allocation nor unique key constraints will fail when rolling back record deletion operations, for example. According to some examples, a basic technique for creating a ghost record is to mark a deleted record as invalid (e.g., by flipping a single status bit in a record header), while retaining the physical record and its associated key (e.g., in a B-tree). The record and its key may remain locked until the deleting transaction commits, for example. As such, in some examples, the ghost record may be transformed into a data record and vice versa by changing a bit of the ghost record or the data record, respectively. Ghost records may facilitate searching within a data structure 120, according to some examples. For example, ghost records may be used in a data structure 120 to improve a performance of an interpolation search by facilitating a substantially uniform distribution of data records within the data structure 120, for example.

The data of the data structure 120 may also or alternatively further comprise record gaps or simply 'gaps'. As used herein, a 'record gap' is an intentionally introduced gap between related sets of data of the data structure 120. For example, the record gap may be introduced at the end of a first set of data to provide a buffer between the first set and a following second set. The buffer may provide room in the first set of data for insertion of new data without requiring a transfer of data between the first set and the second set, for example. Record gaps may be employed to facilitate sorting (e.g., via a library sort), according to some examples.

In some examples, the data structure 120 comprises a tree data structure or simply a 'data tree'. For example, the data tree may be a so-called B-tree. In particular, the data structure 120 may comprise a B+ tree, according to some examples. In other examples, the data structure 120 comprises a hash table or a hash map. Other examples of the data structure 120 include, but are not limited to, a queue, a stack, a heap, a container (e.g., a sorted container), a linked list, a map and a graph.

Figure 4A:
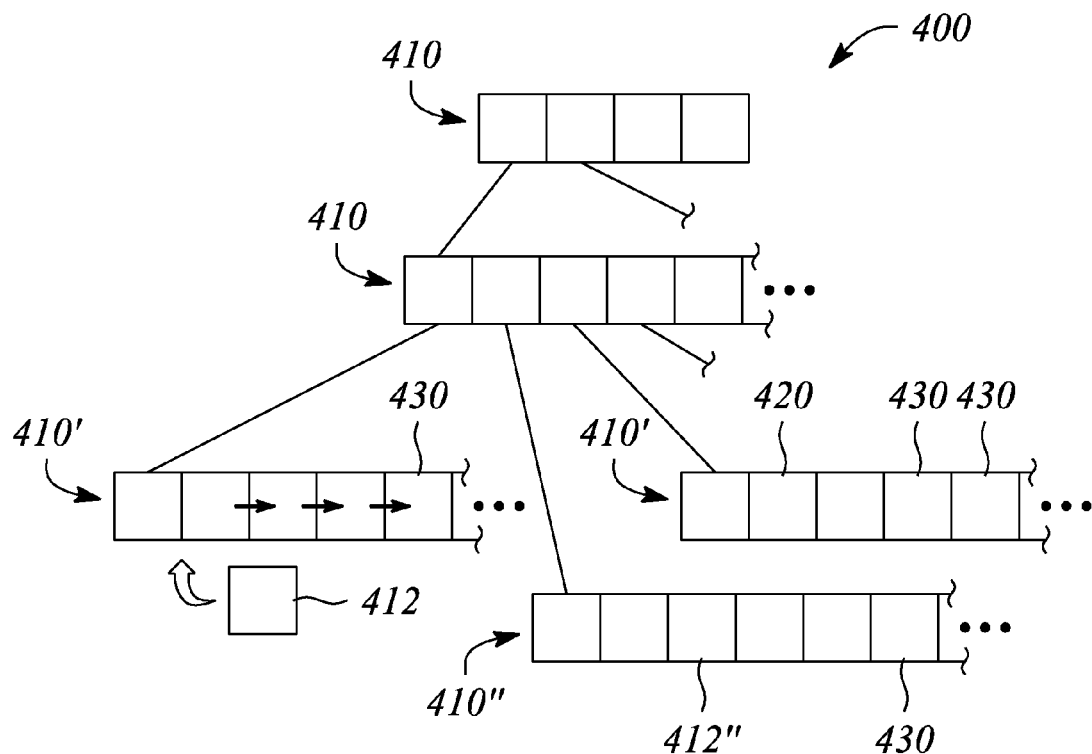
FIG. 4A illustrates a schematic diagram of a portion of an example B+ tree, according to an example of the principles described herein.
Figure 4B:
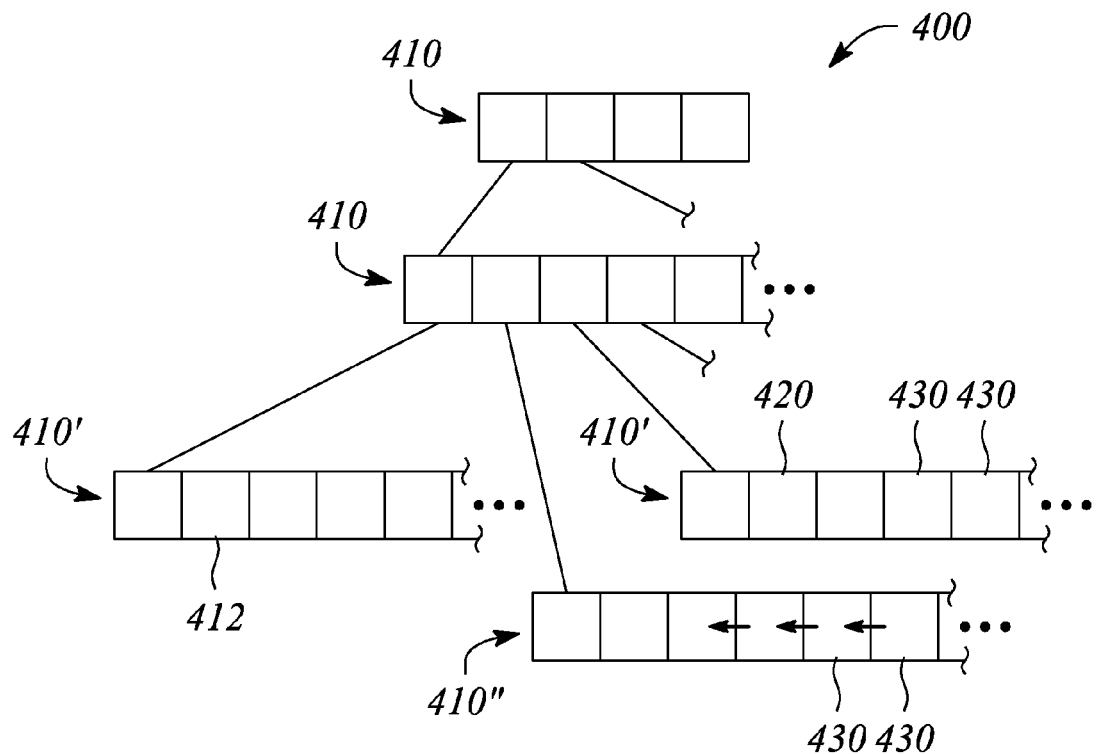
FIG. 4B illustrates the example B+ tree of FIG. 4A, according to another example of the principles described herein.

FIG. 4A illustrates a schematic diagram of a portion of an example B+ tree 400, according to an example of the principles described herein. FIG. 4B illustrates the example B+ tree 400 of FIG. 4A, according to another example of the principles described herein. A B+ tree, also referred to as a 'B plus tree,' is a data structure that comprises a plurality of nodes 410 that collectively organize sorted data. Unique keys generally identify the sorted data within a B+ tree. Terminal nodes 410' are sometimes referred to as a leaf nodes or simply 'leafs' while other nodes 410 may be referred to as interior or branch nodes 410. In a B+ tree, as opposed to a B-tree, all data records are stored in the terminal node or leaf level. Only keys are stored by interior nodes 410, according to some examples.

Insertion of a new data record 412 in the example B+ tree 400 comprises locating an appropriate leaf 410' as well as an insertion point, as illustrated by a hollow arrow in FIG. 4A. A search operation may be used for locating the appropriate leaf 410' and the insertion point, for example. A portion of the data of the identified leaf 410' below the insertion point is then shifted to make room for the new data record 412 within the leaf 410'. Shifting is illustrated by horizontal arrows in FIG. 4A, for example. In addition, the inserted new data record 412 is illustrated having been inserted into the leaf 410' in FIG. 4B. According to various examples, the built-in shifting capability of the memory 110 may be employed to shift (e.g., downshift) the data records below the insertion point to make room for insertion of the new data record 412. The contiguous subset may comprise the data records of the data portion below the insertion point in the leaf 410', according to various examples.

Deletion of an existing data record similarly requires locating an appropriate leaf 410" as well as locating a particular data record 412" to delete, as illustrated in FIGS. 4A and 4B. Once located, the data records of the leaf 410" that are not being deleted (i.e., remaining data records) may be shifted to overwrite the data record 412" designated for deletion, according to some examples. As above, shifting is indicated by horizontal arrows in FIG. 4B. According to various examples, the built-in shifting capability of the memory 110 may be employed to provide the shift (e.g., upshift) of the remaining data records to remove the deletion-designated data record 412" from the leaf 410". The contiguous subset may comprise the remaining data records that are shifted to affect deletion of the deletion-designated data record 412", for example.

In some examples, shifting may or may not result in the creation of one or both of a new leaf 410' and a new node, depending on whether or not a particular leaf 410' is 'full'. In some examples, deletion of a leaf 410' may require or result in deletion of one or both of a leaf 410' and a node 410. One or both of ghost records 420 and a record gap 430 at the end of the leaf 410' may be used to reduce a likelihood that the leaf is full, for example. Ghost records 420 and record gaps 430 are illustrated by way of example in FIGS. 4A and 4B.

Referring back to FIG. 2, in some examples, the shiftable memory 100 supporting in-memory data structure further comprises a data structure operator 130. The data structure operator 130 is configured to operate on the data structure 120 in the memory 110. In particular, the data structure operator 130 performs a data structure operation on the data of the data structure 120. Further, the built-in shifting capability is configured to provide one or both of insertion of the data and deletion of the data in conjunction with the data structure operator 130.

For example, the data structure operator 130 may comprise a library sort operator. The library sort operator is configured to perform a library sort of the data of the data structure 130. In another example, the data structure operator 130 may comprise a rotation operator. The rotation operator is configured to rotate a selected portion (e.g., the contiguous subset) of the data within the data structure 130, according to some examples. The rotation may comprise a data shift either to the left (e.g., a left rotation) or the right (e.g., a right rotation) with data that is shifted out or off of one end of the selected portion being reinserted into an opposite end to produce the data rotation, for example. The data shift may be provided by the built-in shifting capability of the memory 110, for example. Other examples of the data structure operator 130 include, but are not limited to, an interpolation search operator, a binary search operator and a sequential search operator.

In some examples, the data structure operator 130 is implemented as software or firmware (e.g., computer code or instructions) that is stored in a computer readable media and executed by a processor. The computer readable media may include, but is not limited to, one or more of various forms of computer memory (e.g., RAM, ROM, flash memory, etc.), a magnetic disk, and an optical disc of a computer system.

In another example, the data structure operator 130 is implemented in hardware. For example, the data structure operator 130 may be implemented as a machine code instruction of a processor (e.g., a microprocessor) that employs the shiftable memory 100. In another example, the data structure operator 130 may be one or both of implemented within and collocated with circuitry of the shiftable memory 100, itself. For example, the data structure operator 130 may be implemented as logic circuits that are part of the controller 114. In another example, the data structure operator 130 is implemented as an application specific integrated circuit (ASIC) that operates along side the controller 114, for example. In yet other examples, the data structure operator 130 may be implemented as part of a memory controller (not illustrated) that supports and provides an interface to the shiftable memory 100 as part of a memory subsystem. However, while the data structure operator 130 may be implemented remote from other portions of the shiftable memory 100, the data structure operator 130 is considered an element of the shiftable memory 100 by virtue of being defined on the memory 110 and being configured to operate on a contiguous subset of data within the memory 110, according to some examples.

In some examples, the built-in shifting capability of the memory 110 provided by the shiftable memory 100 may facilitate data structures 120 with larger substructures (nodes, leafs, etc.) than may be practical with conventional (non-shiftable) memory. For example, using the built-in shifting of the memory 110 may allow realization of a B+ tree having larger leafs 410' than are practical without the memory 110. The larger leafs 410' may be practical due to efficiencies associated with insertion and deletion of data provided by the substantially constant time data shifting afforded by the built-in shifting capability, for example. According to some examples, larger leafs 410' may provide a concomitant reduction in a depth of the B+ tree and an increase in an amount of data that may be stored. In some examples, efficient insertions and deletions afforded by the built-in shifting capability of the memory 110 may be sufficient to facilitate data structures 120 having the larger substructures. In other examples, efficient insertion and deletion of data in the data structure 120 may be augmented by using selected data structure operators 130.

For example, the data structure 120 may be constructed using from one to perhaps a relatively small number of substantially large arrays (e.g., leafs, nodes, etc.) to hold the data. Record gaps may be pre-inserted along the arrays during construction. The record gaps may be pre-inserted one or more of randomly, periodically, and strategically based on a characteristic of the data (e.g., based on known or expected frequency characteristics of the data to be inserted), for example. According to various examples, the record gaps may have a size that is determined one or more of randomly according to a predetermined formula (e.g., periodic gap size doubling) and strategically based on the data being stored. In some examples, ghost records also may be pre-inserted. For example, ghost records may be included to facilitate or improve a performance of a data structure operator 130 such as, but not limited to, an interpolation search operator.

The memory 110 having built-in shifting capability may be used to one or both of provide efficient insertion of data and provide efficient deletion of data in the substantially large arrays. The presence of one or both of record gaps and ghost records may augment the shifting by the memory 110 by reducing an average size of the contiguous subset that must be shifted to accommodate a particular insertion or deletion, according to some examples. For example, to insert a data record into an array at a particular insertion point, only those existing data records in the array up to a next record gap below the insertion point need to be included in the contiguous subset shifted by the memory 110. The data records in the contiguous subset that are shifted into the next record gap may be effectively absorbed by the record gap (e.g., resulting in a size reduction of the record gap), for example. The use of such record gaps during insertion and deletion is typified by a data structure operator 130 such as, but not limited to, a library sort operator.

Locating and identifying data records in the substantially large arrays to delete or to act as insertion points may be accomplished using a data structure operator 130 that performs a search. Data structure operators 130 that may efficiently search the substantially large arrays to locate and identify a particular data record may include, but is not limited to, an interpolation search operator, a binary search operator and a sequential search operator. The built-in shifting capability of the memory 110 also may be employed to facilitate insertion and adjustment of record gaps and ghost records to augment a performance of the search data structure operators 130. For example, the built-in shifting may be used to redistribute and re-introduce record gaps and ghost records to maintain search performance levels.

Figure 5A:
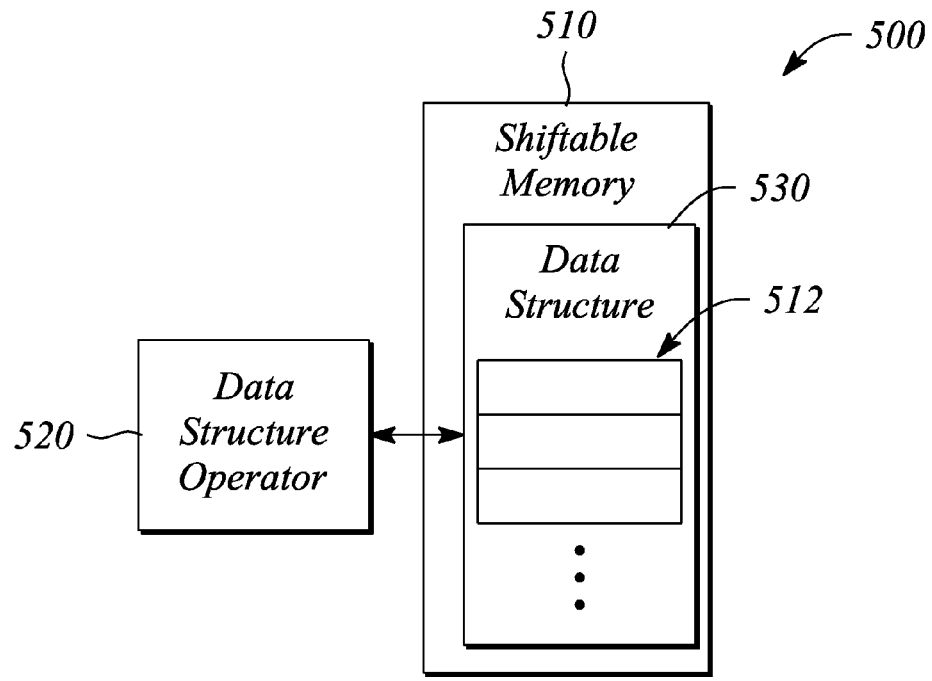
FIG. 5A illustrates a block diagram of a shiftable memory system having in-memory data structure support, according to an example of the principles described herein.
Figure 5B:
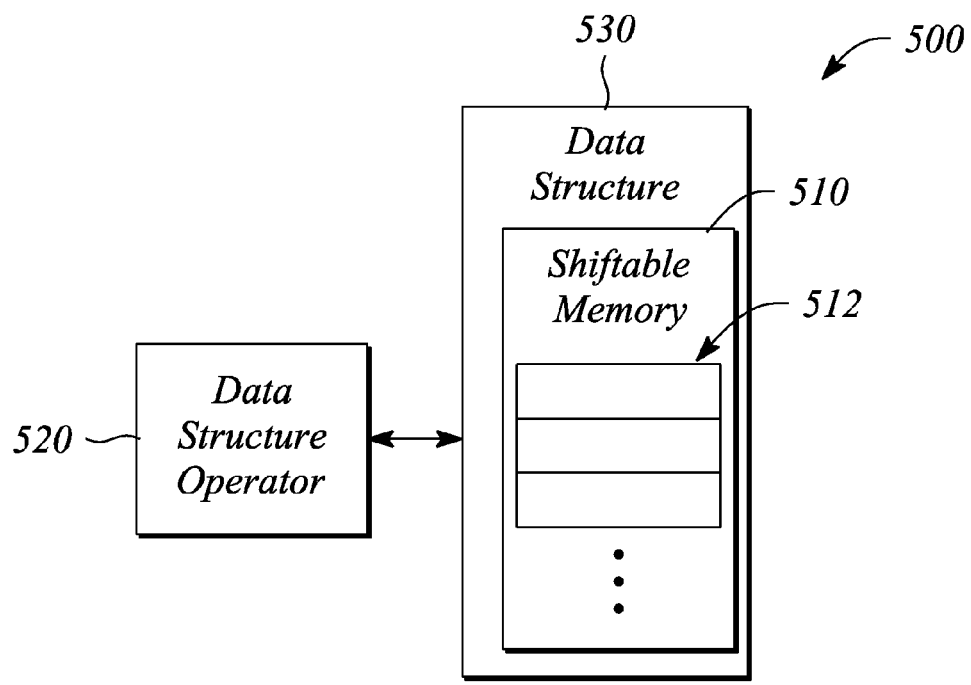
FIG. 5B illustrates a block diagram of a shiftable memory system having in-memory data structure support, according to another example of the principles described herein.

FIG. 5A illustrates a block diagram of a shiftable memory system 500 having in-memory data structure support with a data structure within a shiftable memory, according to an example of the principles described herein. FIG. 5B illustrates a block diagram of a shiftable memory system 500 having in-memory data structure support with a shiftable memory within a data structure, according to another example of the principles described herein. In particular, the shiftable memory system 500 illustrated in FIGS. 5A and 5B comprises a shiftable memory 510. According to some examples, the shiftable memory 510 comprises a plurality of memory cells 512 with built-in data shifting capability. The built-in data shifting is configured to shift a contiguous subset of data stored in the memory cells 512 from a first location to a second location within the shiftable memory 510. The contiguous subset of data has a size (e.g., a length) that is smaller than a total size of the shiftable memory 510. In some examples, the shiftable memory 510 is substantially similar to the memory 110 described above with respect to the shiftable memory 100.

Further, as illustrated in FIGS. 5A and 5B, the shiftable memory system 500 comprises an in-memory data structure 530. According to some examples, the in-memory data structure 530 may be located entirely within the shiftable memory 510, as illustrated in FIG. 5A. In other examples, only a portion of the in-memory data structure 530 is located in the shiftable memory 510, as illustrated in FIG. 5B. For example, a portion of the data of the in-memory data structure 530 may be located in the shiftable memory 510 while a remaining portion of the data may be located in another memory (not illustrated). The other memory may be conventional or substantially non-shiftable memory, for example. When only a portion of the in-memory data structure 530 is in the shiftable memory 510, the shiftable memory system 500 may be viewed as having the shiftable memory 510 within the data structure 530, for example.

In some examples, the portion of the data that is located in shiftable memory 510 may change from time-to-time. For example, data may be moved from the other memory (e.g., non-shiftable memory) into the shiftable memory 510 and then back to the other memory. The data may be moved into shiftable memory 510 for one or more of a shifting operation, an insertion operation, a deletion operation and any of a variety of other operations that may employ data shifting, for example. Such an arrangement of the shiftable memory 510 and the other memory may be referred to as a hierarchy of memory mediums. In addition to the shiftable memory 510, the hierarchy of memory mediums may include other memory comprising one or more of cache (e.g., L1 cache, L2 cache, etc.), RAM, disk (e.g., magnetic, optical, etc.) and flash memory, according to various examples.

For example, the in-memory data structure 530 may be a B-tree in which substantially all of the B-tree levels except for the leaf nodes or pages may fit into a buffer pool in RAM memory (e.g., the other memory). For the leaf pages, a buffer pool might employ a least-recently-used (LRU) replacement policy, for example. Furthermore, as data may be frequently updated in the leaf pages, leaf pages may be periodically moved into shiftable memory 510 while being edited. Thus, for searches with random search keys, only a single I/O operation is required, similar to a hash index, if one is available, for example. It should be understood that other criteria may be used in the selection of which portions of the data structure are to be moved into and out of the shiftable memory 510, according to various examples.

The shiftable memory system 500 illustrated in FIGS. 5A and 5B further comprises a data structure operator 520. The data structure operator 520 is defined on the shiftable memory 510 and is configured to operate on the in-memory data structure 530. The in-memory data structure 530 is configured to contain data comprising the contiguous subset, in some examples. According to some examples, the built-in shifting capability of the shiftable memory 510 is one or both of configured to facilitate sorting and configured to maintain a substantially sorted order of the data in the data structure in conjunction with the data structure operator 520. In some examples, the data structure operator 520 is substantially similar to the data structure operator 130, described above with respect to the shiftable memory 100.

In particular, in some examples, the data structure operator 520 comprises a search operator. For example, the data structure operator 520 may comprise one or more of an interpolation search operator, a binary search operator, and a sequential search operator. In some examples, the data structure operator 520 comprises a sort operator. For example, the data structure operator 520 may comprise a library sort operator. In another example, the data structure operator 520 comprises a rotation operator.

Figure 6:
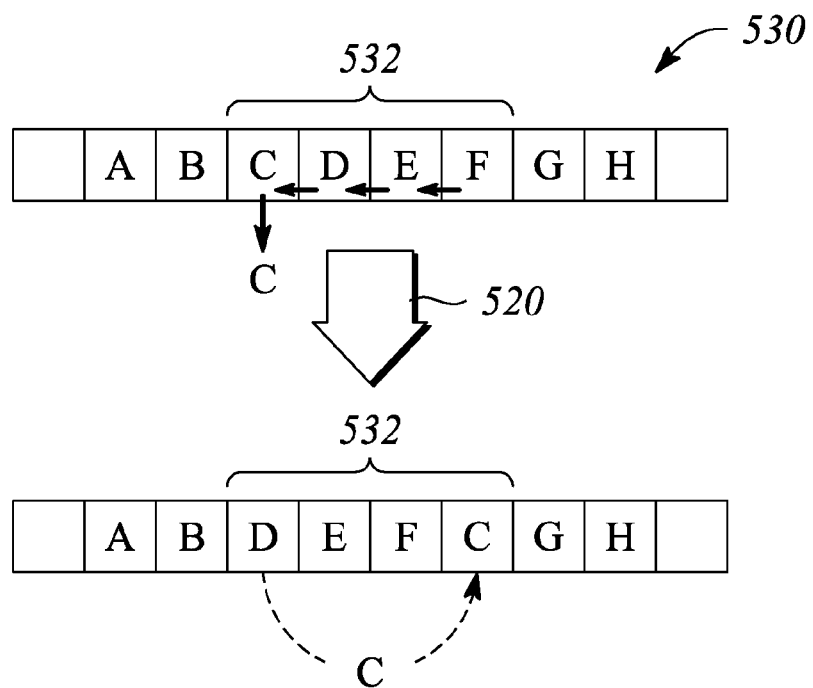
FIG. 6 illustrates a schematic diagram of an in-memory data structure before and after data rotation, according to an example of the principles described herein.

FIG. 6 illustrates a schematic diagram of an in-memory data structure 530 before and after data rotation, according to an example of the principles described herein. As illustrated in a top portion of FIG. 6, the in-memory data structure 530 contains an eight-character string 'ABCDEFGH' prior to data rotation by a data structure operator 520. A bottom portion of FIG. 6 illustrates the eight-character string following an example of a left-directed rotation of a four-character segment 532 within the string, for example. The data structure operator 520 may comprise a rotation operator to provide the data rotation, for example. Following the data rotation, the eight-character string is a rotated string 'ABDEFCGH', as illustrated.

In particular, the four-character segment 532 initially begins with a character 'C' while after rotation, the four-character segment 532 begins with a character 'D', as illustrated. According to some examples, execution of the rotation operator to produce the data rotation may comprise copying the character 'C' to a temporary memory location (not illustrated), shifting characters 'DEF' to the left, and then inserting the previously stored character 'C' back into the eight-character string. Specifically, the character 'C' is inserted into a position opened up by the shift at an end of the rotated string between the character 'F' and a character 'G'. The four-character segment 532 may be the contiguous subset and the shift may be performed by the shifting capability of the shiftable memory system 500, according to various examples. As illustrated, a curved arrow in FIG. 6 illustrates a motion of the character 'C' from a beginning to an end of the rotated string during data rotation.

Referring again to FIGS. 5A and 5B, the built-in shifting capability of the shiftable memory 510 may facilitate one or both of inserting and deleting data records of the data structure 530, according to various examples. In some examples, the data structure 530 comprises a substantially sorted array of data records. In some examples, data of the data structure 530 comprise one or both of ghost records and record gaps.

Figure 7:
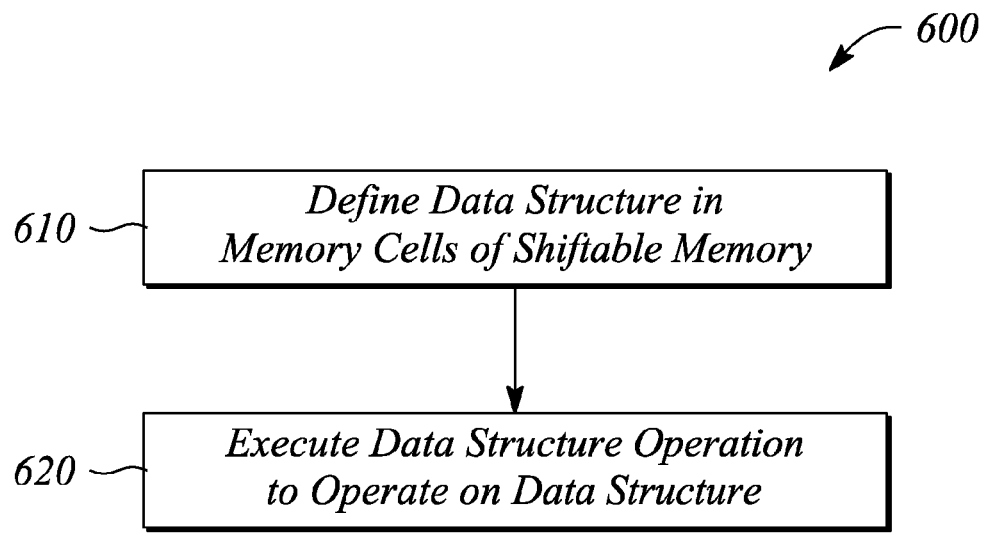
FIG. 7 illustrates a flow chart of a method of shiftable memory with in-memory data structures, according to an example of the principles described herein.

FIG. 7 illustrates a flow chart of a method 600 of using shiftable memory with in-memory data structures, according to an example of the principles described herein. As illustrated, the method 600 of using shiftable memory with in-memory data structures comprises defining 610 a data structure in memory cells of the shiftable memory. The shiftable memory has a plurality of memory cells with built-in shifting capability to shift a contiguous subset of data in the data structure from a first location to a second location. In some examples, the shiftable memory is substantially similar to the memory 110 having built-in shifting capability described above with respect to the shiftable memory 100. In particular, a size of the contiguous subset of data of the shiftable memory is less than a total size of the shiftable memory and the built-in shifting comprises one or both of an upshift and a downshift, according to various examples.

The method 600 of using shiftable memory with in-memory data structures further comprises executing 620 a data structure operator. The data structure operator operates on the data structure when executed 620. The data structure comprises the contiguous subset of data. In some examples, the data structure operator is one or both of configured to sort the data and configured to substantially maintain a sorted order of the data of the data structure using the built-in shifting capability of the shiftable memory. In some examples, the data structure is substantially similar to the data structure 120 described above with respect to the shiftable memory 100. Further, in some examples, the data structure operator is substantially similar to the data structure operator 130 described above with respect to the shiftable memory 100.

In some examples, executing 620 the data structure operator comprises one or both of performing a sort of the data of the data structure and performing a search of the data structure. In various examples, the built-in shifting capability is used to one or both of downshift the contiguous subset of data to facilitate inserting data in the data structure and upshift the contiguous subset of data to facilitate deleting data from the data structure. In some examples, the method 600 of using shiftable memory with in-memory data structures further comprises inserting one or both of ghost records and record gaps in the data of the data structure.

Thus, there have been described examples of a shiftable memory and a shiftable memory system each supporting in-memory data structures, and a method of using shiftable memory with in-memory data structures. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory supporting in-memory data structures comprising:

a memory having built-in shifting capability to shift a contiguous subset of the data from a first location to a second location within the memory, the contiguous subset of data having a size that is smaller than a total size of the memory, the built-in shifting capability to shift only data of the contiguous subset; and a data structure defined on the memory to contain data comprising the contiguous subset, the built-in shifting capability to facilitate one or more of movement of the data, insertion of the data and deletion of the data within the data structure, wherein the data structure defined on the memory is located in both of the memory having built-in shifting capability and another, non-shiftable memory.

2. The shiftable memory supporting in-memory data structures of claim 1, wherein the data structure comprises a data tree.

3. The shiftable memory supporting in-memory data structures of claim 2, wherein the data tree comprises a B+ tree.

4. The shiftable memory supporting in-memory data structures of claim 1, wherein the data structure comprises a hash table.

5. The shiftable memory supporting in-memory data structures of claim 1, wherein the data of the data structure comprises one or both of ghost records and record gaps.

6. The shiftable memory supporting in-memory data structures of claim 1, further comprising a data structure operator to operate on the data structure in the memory.

7. The shiftable memory supporting in-memory data structures of claim 6, wherein the built-in shifting capability in conjunction with the data structure operator to provide one or both of sorting data of the data structure and maintaining a substantially sorted order of the data in the data structure.

8. The shiftable memory supporting in-memory data structures of claim 6, wherein the data structure operator comprises one or more of a library sort operator, an interpolation search operator, a binary search operator and a sequential search operator.

9. A shiftable memory system having in-memory data structure support comprising:

a shiftable memory comprising a plurality of memory cells with built-in data shifting capability to shift a contiguous subset of data stored in the memory cells from a first location to a second location within the shiftable memory, a size of the contiguous subset being smaller than a total size of the shiftable memory; and a data structure operator defined on the shiftable memory to operate on an in-memory data structure, the in-memory data structure to contain data comprising the contiguous subset, wherein the data structure operator comprises one or more of: a rotation operator; an interpolation search operator; a binary search operator; and a sequential search operator, wherein the built-in data shifting capability in conjunction with the data structure operator facilitate one or more of moving data records of the data structure, inserting data records of the data structure and deleting data records of the data structure.

10. The shiftable memory system of claim 9, wherein the data structure operator comprises a sort operator to one or both of sort the data in the data structure and maintain a substantially sorted order of the data in the data structure, the data structure comprising a substantially sorted array of data records.

11. A method of using shiftable memory with in-memory data structures, the method comprising:

defining a data structure comprising memory cells of the shiftable memory, the shiftable memory having a plurality of memory cells with built-in shifting capability to shift a contiguous subset of data from a first location to a second location within the shiftable memory, a size of the contiguous subset of data being less than a total size of the shiftable memory;

inserting one or both of ghost records and record gaps in the data of the data structure; and executing a data structure operator to operate on the data structure, the data structure to contain data comprising the contiguous subset of data, wherein the built-in shifting capability of the shiftable memory facilitates executing the data structure operator by providing one or both of a downshift an upshift of the contiguous sub set.

12. The method of using shiftable memory with in-memory data structures of claim 11, wherein executing a data structure operator further comprises performing a search of the data of the data structure, and wherein the built-in shifting capability to facilitate one or both of sorting the data of the data structure and maintaining a substantially sorted order of the data of the data structure.

* * * * *